United States Patent [19]

Nomura et al.

[11] Patent Number: 5,359,559

[45] Date of Patent: Oct. 25, 1994

[54] SEMICONDUCTOR MEMORY DEVICE HAVING REDUNDANT MEMORY CELLS

[75] Inventors: Masayoshi Nomura, Ryugasaki; Kenya Adachi, Ibaraki, both of Japan

[73] Assignee: Texas Instruments Incorporated, Dallas, Tex.

[21] Appl. No.: 143,510

[22] Filed: Oct. 26, 1993

Related U.S. Application Data

[63] Continuation of Ser. No. 884,091, May 15, 1992, abandoned.

Foreign Application Priority Data

May 21, 1991 [JP] Japan .................................. 3-146800

[51] Int. Cl.$^5$ .............................................. G11C 7/00
[52] U.S. Cl. .................................. 365/200; 365/225.7; 365/230.06
[58] Field of Search ................. 365/200, 225.7, 230.06

[56] References Cited

U.S. PATENT DOCUMENTS

| | | | |
|---|---|---|---|
| 4,757,474 | 7/1988 | Fukushi et al. | 365/200 |
| 4,817,056 | 3/1989 | Furutani et al. | 365/200 |
| 4,881,202 | 11/1989 | Tsujimoto et al. | 365/225.7 |
| 4,947,375 | 8/1990 | Gaultier et al. | 365/200 |
| 5,047,983 | 9/1991 | Iwai et al. | 365/230.06 |

Primary Examiner—Eugene R. LaRoche
Assistant Examiner—F. Niranjan
Attorney, Agent, or Firm—Douglas A. Sorensen; Richard L. Donaldson; William E. Hiller

[57] ABSTRACT

The described embodiments of the present invention provide a method in which the circuit configuration of redundancy circuitry in a random access memory can be simplified and the setting operation of the address of the defective memory cell is also simplified. In one described embodiment, the redundant circuit includes a fuse decoder (11), which functions as the address-generating circuit for the address of the defective memory cell, and a latch circuit (21). A write operation to the defective memory cell on the write port containing the fuse decoder (11) causes the address of the defective cell to be stored in the latch circuit. Each input/output port, except the input port using the fuse decoder, includes a comparator (22) for comparing the address for an operation on the respective port to the address stored in the latch circuit. A timing logic circuit (23) responds to a coincident signal generated by the comparator by providing signals which enable access to the redundant memory cell rather that the defective memory cell.

6 Claims, 3 Drawing Sheets

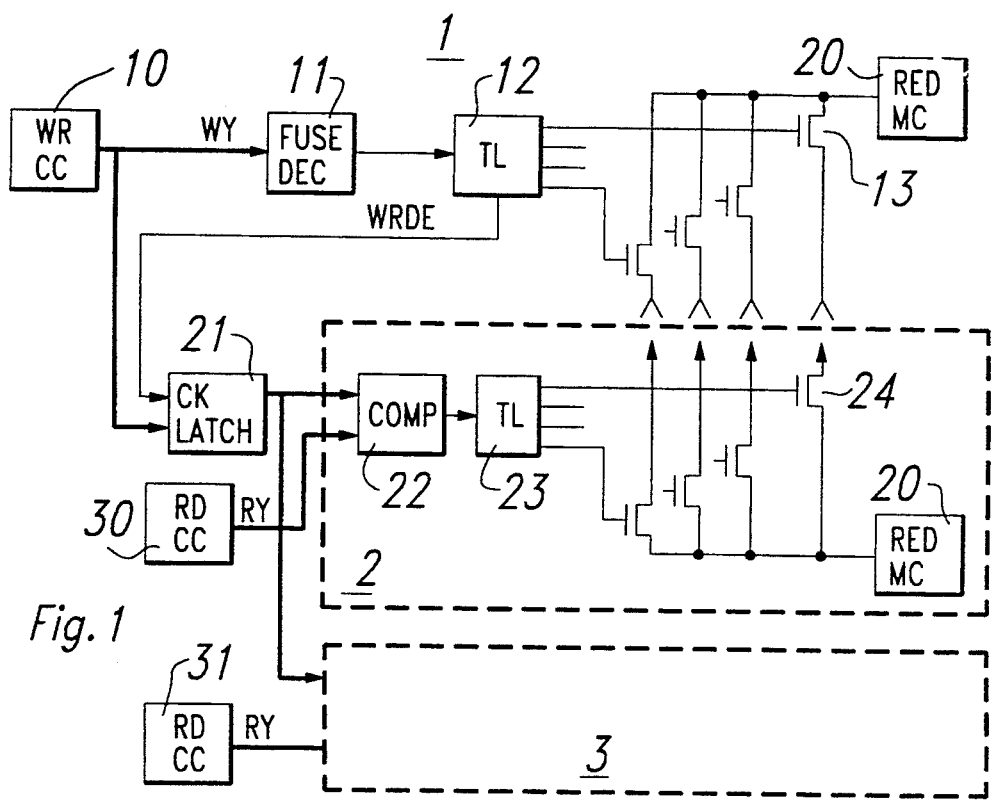
Fig. 1
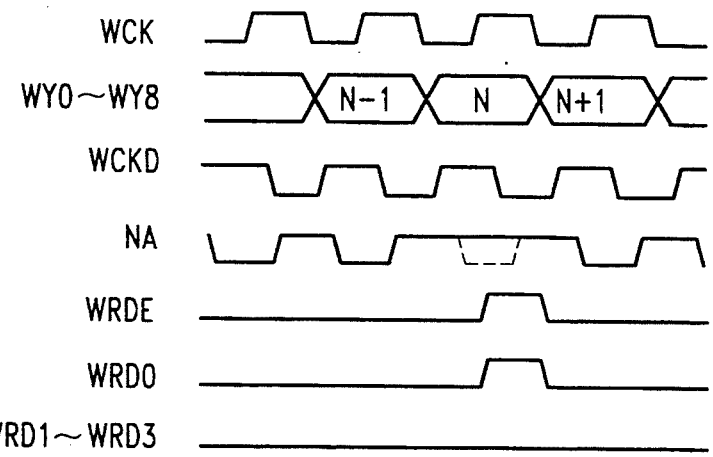
Fig. 3
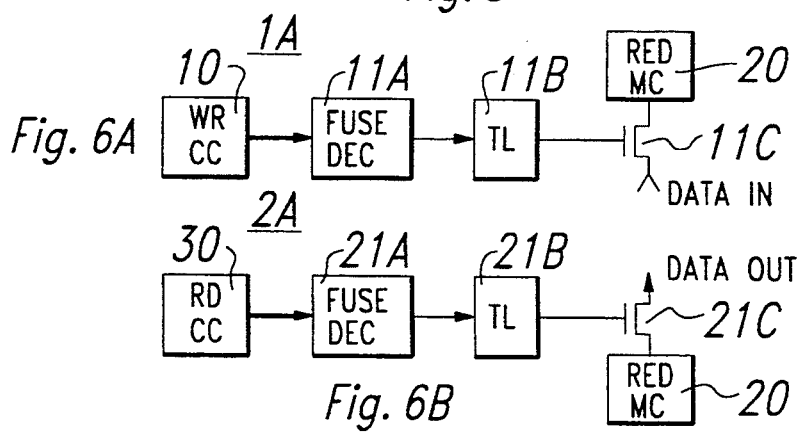
Fig. 6A
Fig. 6B

SEMICONDUCTOR MEMORY DEVICE HAVING REDUNDANT MEMORY CELLS

This application is a continuation of application Ser. No. 07/884,091, filed May 15, 1992 now abandoned.

This invention concerns a type of semiconductor memory device. More specifically, this invention concerns a type of selecting circuit of the redundant memory cell in the multi-port memory device having a redundant memory cell.

PRIOR ART

In order to increase the yield of the semiconductor memory device, a preparatory memory cell (redundant memory cell or preparatory memory cell) is formed in the semiconductor memory device; if the intrinsic memory cell becomes defective, the aforementioned redundant memory cell can be used as the save memory cell for the defective memory cell. This scheme is now widely applied. In this case, the semiconductor memory device should contain a circuit for selecting the redundant memory cell in addition to the redundant memory cell itself.

The aforementioned redundant circuit is formed row and column respectively. In the case when the defective bit address is decoded by a redundant decoder, the address of the intrinsic memory cell and that of the redundant memory cell are exchanged with each other.

FIG. 6 shows the configuration of the redundant circuit. FIG. 6 (A) shows the configuration of the write port, while FIG. 6 (B) shows the configuration of the read port.

As far as write port (1A) is concerned, in fuse decoder (11A), there are a plurality of fuses (not shown in the figure) formed by polysilicon. These fuses can be fused by a laser beam, etc., corresponding to the bit address (column) to be saved.

With the write operation, write column address signal WY from write column counter (10) is input to fuse decoder (11A); if the value of the write column address signal is coincident with the address defined by the laser fusion operation, timing logic circuit (11B) is activated, MOS transistor (11C) which functions as a gate circuit is energized (turned on), and redundant memory cell (20), connected on its tip, is activated.

For the fuses (not shown in the figure) in fuse decoder (21A) in read port (2A), the fusion operation can also be carried out by laser in the same way as the fuses in fuse decoder (11A) in said write port (1A). Consequently, in read port (2A), too, when read column signal RY is generated from read column counter (30), fuse decoder (21A), timing logic circuit (21B), and MOS transistor (21C) perform the same operation as above, and the information stored in said redundant memory cell (20) can be read out.

As shown in FIG. 6, a plurality of fuses is formed in fuse decoder (11A) in write port (1A), and in fuse decoder (21A) in read port (2A), respectively. A laser fusion operation is carried out to ensure that these fuses are fused so that they correspond to the same address; hence, it is necessary to form fuses for two sets or multiple sets with a number equal to the number of ports. But the space for forming the fuses is large. This is a problem.

In particular, as the memory capacity of the overall semiconductor memory device is increased, the amount of fuses also increases, the area of the fuse formation region increases, and the In addition, for the field memory which has many input/output ports, as a set of the aforementioned fuse decoders is to be set up for each port, there is a large number of fuses; thus the aforementioned problem is exacerbated.

On the other hand, for the address of the same save memory cell, it is necessary to carry out the laser fusion treatment for each port, and a lot of time is needed to carry out the address-setting operation for the various fuse decoders. This is also a disadvantage.

OBJECT OF THE INVENTION

An object of the present invention is to increase the integration level of the multi-port semiconductor memory device having a redundant circuit, to prevent errors in setting the address, and to improve the processing capability of the operation.

SUMMARY OF THE INVENTION

In order to solve the aforementioned problems, this invention provides a type of semiconductor memory device characterized by the following facts: the semiconductor memory device has a redundant memory cell as well as an input port and output port; when the intrinsic memory cell is defective, the aforementioned redundant memory cell is used as the memory cell for saving the defective memory cell. In this semiconductor memory device, there is an address-generating circuit which generates the address of the defective memory cell, and an address storage circuit that stores the address from the aforementioned address-generating circuit. For each of the aforementioned ports, there is an address comparison circuit which compares the address stored in the aforementioned address storage circuit and the access address, and which sends out a coincident signal when the aforementioned addresses are coincident; and a gate circuit which is connected to the aforementioned redundant memory cell, which is energized in response to the aforementioned coincident signal, and which energizes the aforementioned redundant memory cell.

The aforementioned address-generating circuit has a plurality of fuses. The fuses are fused beforehand according to the prescribed bit address. It is also possible to arrange a latch circuit in the aforementioned address-generating circuit and to set the aforementioned address in the latch circuit.

The address-generating circuit generates the address of the defective memory cell. The method for generating this address may be the same as that used in the conventional method, such as fusion of fuses or presetting the aforementioned address in the latch circuit and then generating the aforementioned address using the latch circuit.

The address storage circuit stores the address from the address-generating circuit. The initial timing operation when the power source is turned on for the semiconductor memory device is taken as the storage timing.

The address comparison circuit receives a storage address from the address storage circuit and the address for memory access as inputs, and compares them with each other. If they are found to coincide with each other, a coincident signal is output. As a response to the address coincident signal from the address comparison circuit, the gate circuit is energized. As the redundant circuit is connected to the gate circuit, as a response to the aforementioned energizing state, the redundant memory cell is energized.

In the aforementioned access operation, there is an access for writing and one for reading. In the aforementioned energizing operation, there is also the write operation and the read operation.

As can be seen from the aforementioned configuration, each port contains no conventional fuse decoder. Consequently, it is possible to prevent a decrease in the integration level due to the need of setting a large number of fuses. In addition, as a single common address-generating circuit is set for the defective memory cells, the address-setting operation becomes simpler, and there are less errors caused by the need for setting multiple fuse decoders.

In the address-generating circuit for the defective memory cell, it is possible to use fuses in the same way as the conventional scheme. However, as there is no need to set the fuses for each port, the integration level can still be increased even when the fuses are used.

BRIEF DESCRIPTION OF THE DRAWINGS

FIG. 1 is a circuit configuration diagram of a redundant circuit in a first embodiment of the semiconductor memory device of this invention.

FIG. 3 is a timing chart illustrating the write operation of the redundant circuit of FIG. 2.

FIG. 6 illustrates a conventional redundant circuit. (A) is a circuit configuration diagram of the circuit in the write port, (B) is a circuit configuration diagram of the circuit in the read port.

In reference numerals as shown in the drawings:

Figure 2:
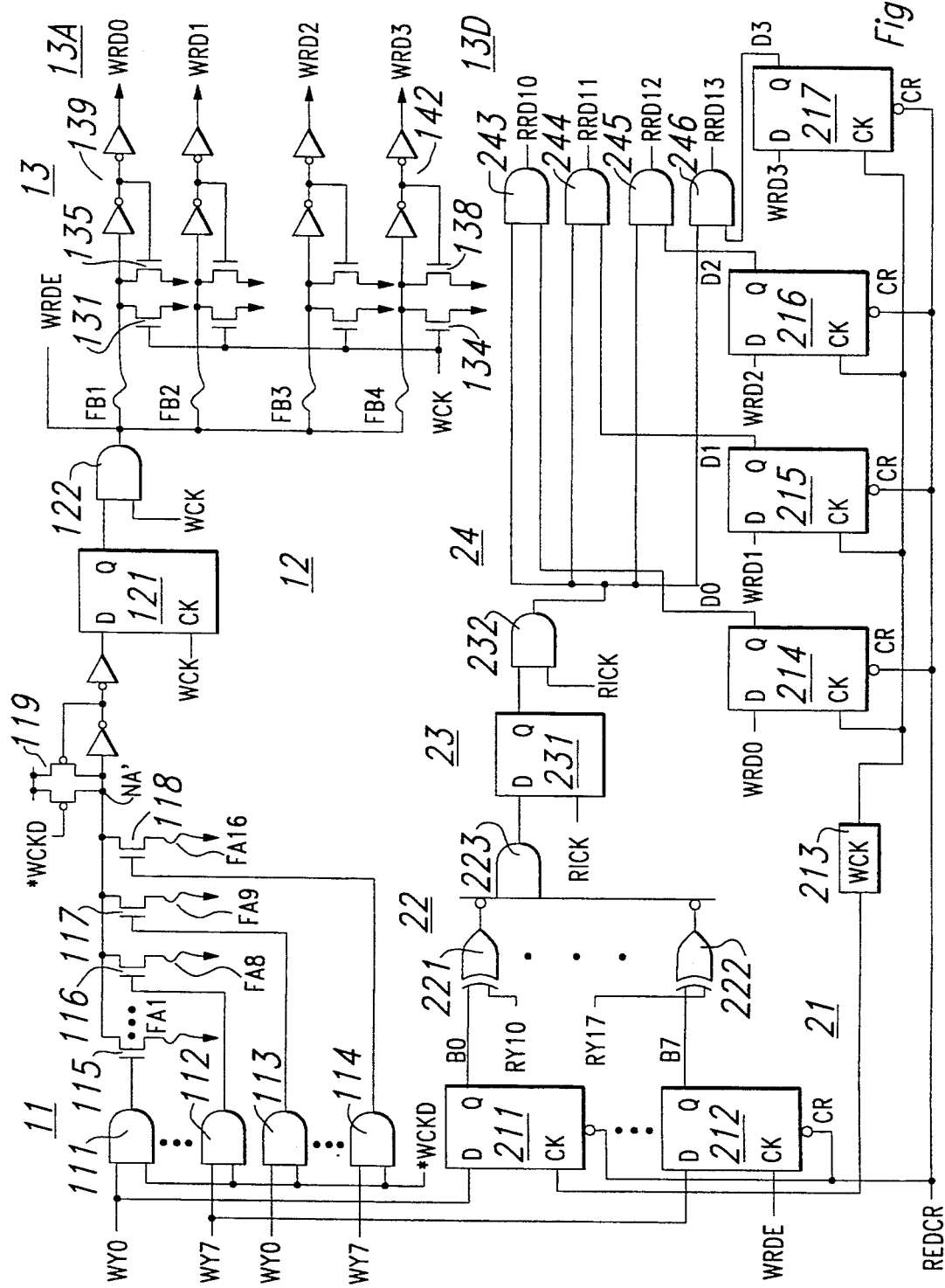
FIG. 2 is a detailed circuit configuration diagram of the redundant circuit shown in FIG. 1.
Figure 4:
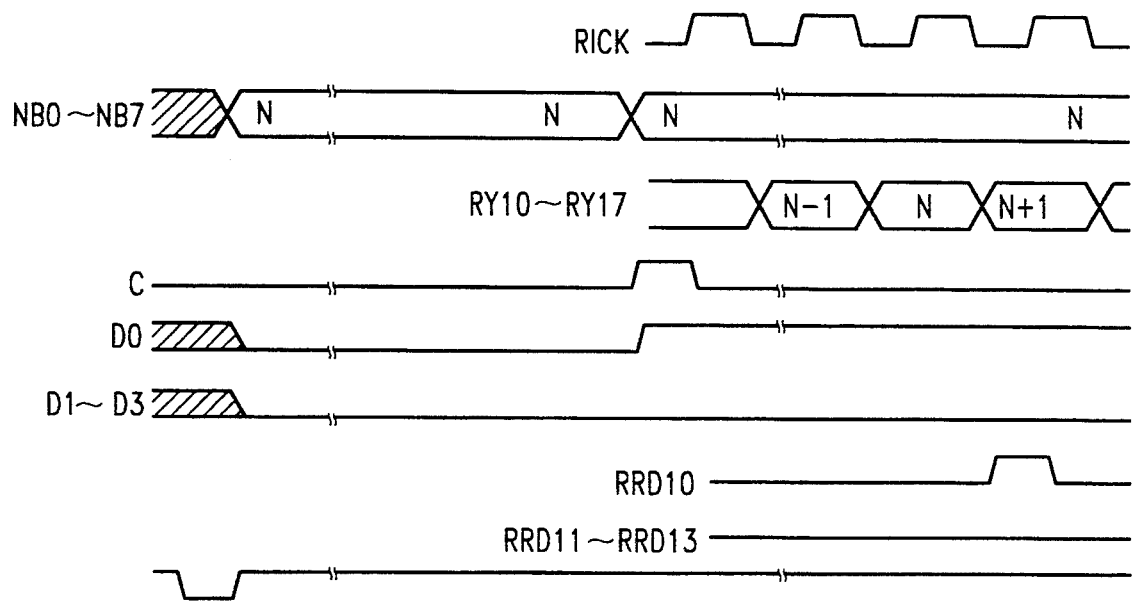
FIG. 4 is a timing chart illustrating the read operation of the redundant circuit of FIG. 2.

1,6 write ports
2,5 read ports
10, write column counter
11, fuse decoder
12, timing logic circuit
13, gate circuit
20, redundant memory cell
21, latch circuit
22, address comparison circuit
23, timing logic circuit
24, gate circuit
30, read column counter

DESCRIPTION OF THE PREFERRED EMBODIMENTS

The redundant circuit configuration in a first embodiment of the semiconductor memory device of this invention may be explained with reference to FIG. 1. FIG. 1 shows the circuit configuration of the portion related to the redundant circuit of this invention. The redundant circuit in this embodiment is the redundant circuit in a semiconductor memory device having one write port and a plurality of read ports (2–3). The intrinsic memory cells and the other circuit configuration needed for memory access are omitted here.

This redundant circuit has write column counter (10) which generates write column address signal WY in the write operation, fuse decoder (11), timing logic circuit (12), gate circuit (13) consists of MOS transistors, and redundant memory cell (20).

Fuse decoder (11), timing logic circuit (12) and gate circuit (13) are set in the write port.

There is a plurality of gate circuits (4 in this embodiment) driven by timing logic circuit (12), in parallel to each other, and corresponding to the bit configuration of the semiconductor memory device.

In read port (2), there is latch circuit (21) that functions as the address memory circuit, address comparison circuit (22), timing logic circuit (23), and gate circuit (24) consists of MOS transistors. Gate circuit (24) is connected to said redundant memory cell (20). In addition, read column counter (30) that generates read column address signal RY in the read operation is connected to address comparison circuit (22). The circuit configuration of read port (3), with the internal circuit details not shown is almost identical to the circuit configuration of read port (2); they share latch circuit (21).

In fuse decoder (11), there is a plurality of fuses with a number equal to the settable number of addresses in the memory cell. These fuses are made of polysilicon formed in the semiconductor device. These fuses are fused beforehand by laser so as to set the address of the defective memory cell. For example, it is possible to use the laser to fuse the corresponding fuses beforehand.

In the following, the write operation of the redundant circuit shown in FIG. 1 will be explained.

In the write operation, write column address signal WY is generated from write column counter (10). This write column address signal WY is applied to fuse decoder (11). In fuse decoder (11), if the aforementioned write column address signal is coincident with the write column address defined by the fuses fused by laser beam, an address coincident signal is output. Corresponding to this address coincident signal, timing logic circuit (12) turns on corresponding gate circuit (13).

Redundant memory cell (20) is connected to gate circuit (13). Instead of the defective memory cell as the memory cell corresponding to the aforementioned write column address, data is written into redundant memory cell (20).

In the write operation into said redundant memory cell (20), repair address latch signal WRDE is output from timing circuit (12).

This repair address latch signal WRDE is applied on clock terminal CK of latch circuit (21) in read port (2), and the write column address signal WY from write column counter (10) is latched in latch circuit (21).

In the following, the read operation will be explained.

In the read operation, read column address signal RY is generated from read column counter (30). This read column address signal RY is applied to address comparison circuit (22) and compared with the address stored in latch circuit (21). When these addresses are coincident, address comparison circuit (22) outputs an address coincident signal to timing logic circuit (23). In the same way as in said timing logic circuit (12), timing logic circuit (23) turns on corresponding gate circuit (24), connected to redundant memory cell (20). In this way, the read operation is carried out from redundant memory cell (20).

For redundant memory cell (20), after the write operation is carried out, the read operation of the content of the memory cell is carried out. In the initial write operation after start-up of the semiconductor memory device, the address of the defective memory cell is automatically stored in latch circuit (21) in read port (2), and the address set in fuse decoder (11) is used to perform the read operation for said redundant memory cell (20).

In this embodiment, it is only necessary to set fuses in fuse decoder (11) in write port (1); there is no need to set them in read ports (2) and (3).

In the case when the number of write ports is increased, fuse decoder (11) is only set in a certain write port, such as the first write port. For the other write ports, it is only necessary to set the circuits corresponding to address comparison circuit (22), timing logic circuit (23), and gate circuit (24) in read port (2); for the defective memory cell's address, the output address of circuit (21) is input. The write column address signal WY from the write column counter in the write port is applied to the address comparison circuit corresponding to address comparison circuit (22) in the write port; the aforementioned address comparison is carried out for the write column address signal.

FIG. 2 shows the detailed circuit configuration of write port (1) and read port (2) of the redundant circuit shown in FIG. 1. Write column counter (10), gate circuit (13), redundant memory cell (20), and read column counter (30) shown in FIG. 1 are not shown in FIG. 2.

From write column counter (10), write column address signal WY [is sent], in this circuit, 16-bit write column address signals WY0–WY7, *WY0–*WY7 (where * indicates signal inversion; the same applies to the following) are input to fuse decoder (11), which has 16 first-group fuses FA (1)–FA (16). These fuses FA (1)–FA (16) are formed by the polysilicon layer of the semiconductor device. In addition, these fuses FA (1)–FA (16) are fused by laser beam beforehand, in correspondence to the address of the defective memory cell.

In addition, fuse decoder (11) also has AND-gates (111)–(114), and MOS transistors (115)–(118) which are connected to the outputs of said AND-gates (111)–(114). For each of AND-gates (111)–(114) and transistors (115)–(118), 16 fuses FA (1)–FA (16), that is, the number corresponding to the address of the defective memory cell, are set in parallel.

In order to boost the voltage of node NA of the power source voltage line of transistors (115)–(118), charge-up circuit (119) is set.

Timing logic circuit (12) has delay-type flip-flop DFF (121), AND-gate (122), second-group fuses FB (1)–FB (4), 4 first-group transistors (131)–(134), 4 second-group transistors (135)–(138), and transistor gates (13A)–(13D) consist of serial invertor circuits (139)–(142). The tips of these transistor gates (13A)–(13D) are connected to the gate circuits, respectively.

One of the second-group fuses, FB (1), connected to the redundant memory cell used, is fused by laser beam beforehand.

Latch circuit (21) in read port (2) has 8 [DFFs], DFF (211)–DFF (212), which store write column address signals WY0–WY7, delay circuit (213), and 4 [DFFs], DFF (214)–DFF (217), that store output signals WRD0–WRD3 from timing logic circuit (12). In addition, DFF (214)–DFF (217) are circuits used for storing the fusion state of second-group fuses FB (1)–FB (4) in timing logic circuit (12).

Address comparison circuit (22) has 8 Exclusive-OR (EOR) [sic; XOR] gates (221)–(222), and NOR-gate (223).

Timing logic circuit (23) consists of DFF (231), AND-gate (232), and 4 parallel AND-gates (243)–(246). The tips of these AND-gates are connected to gate circuits. Applied on one input terminal of these AND-gates is the Q-output of DFF (214)–DFF (217) which store signals WRD0–WRD3 that show the fusion state of the fuses of timing logic circuit (12); hence, gate circuit (24) is connected to the same redundant memory cell as the redundant memory cell connected to gate circuit (13).

The write operation of the redundant circuit in FIG. 2 can be explained with reference to the write timing chart in FIG. 3.

In this embodiment, the memory cell of bit address N is replaced by the redundant memory cell. For this purpose, laser fusion operation is carried out for first-group fuses FA (1)–FA (16) corresponding to address N of fuse decoder (11).

Corresponding to write clock WCK, the write column address as shown by write column address signals WY0–WY7 from write column counter (10) is renewed.

Inverted and delayed write clock *WCKD, which is delayed by a predetermined time from write clock WCK and then inverted, is applied to AND-gates (111)–(114) in fuse decoder (11). In the case when the outputs of AND-gates (111)–(114) indicate address N, the potential at node NA is not on the "low" level as indicated by the broken-line data, but is on the "high" level. This indicates that the write column address from write column counter (10) and the setting address that indicates the fusion state of the fuses are coincident. Hence, fuse decoder (11) also functions as an address coincident circuit.

The aforementioned level signal of node NA is applied on DFF (121) via charge-up circuit (119), and is latched corresponding to write clock WCK. The Q-output of DFF (121) is applied on AND-gate (122); at the next timing of write clock WCK, it is output as repair address latch signal WRDE from AND-gate (122).

In this embodiment, second-group fuse FB (1) in timing logic circuit (12) is fused by laser. Consequently, only write data WRD0 is on the "high" level, and data write is carried out into the corresponding memory cell in the redundant memory cell by write data WRD0.

Figure 5:
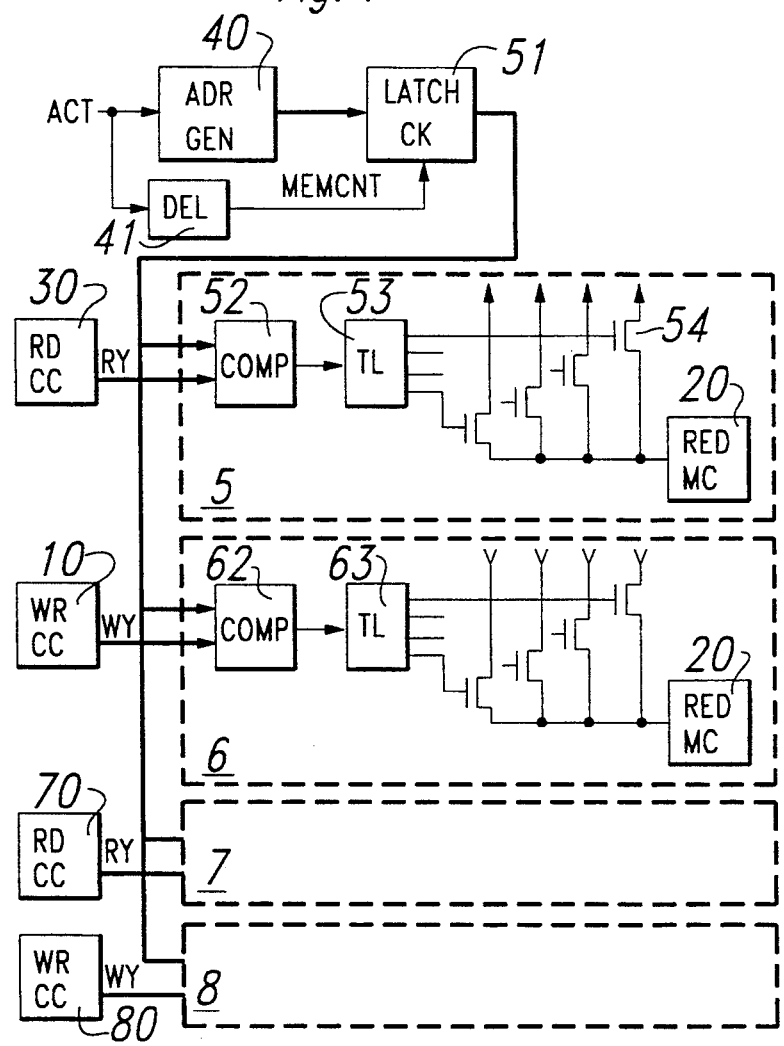
FIG. 5 is a circuit configuration diagram of a redundant circuit in a second embodiment of the semiconductor memory device in this invention.

With reference to the read timing chart shown in FIG. 5, the read operation of the redundant circuit in FIG. 2 can be explained.

Before the read operation is carried out, in the initial state of the semiconductor memory device, the "low" level read clear signal REDCR is output from a memory control circuit not shown in the figure, and DFFs (211)–(212) which store the values of write column address signals WY0–WY7 in write circuit (21) are reset.

In the initial operation of the semiconductor memory device, before the read operation, the aforementioned write operation is carried out. In the aforementioned write operation, when repair address latch signal WRDE is generated, the values of write column address signals WY0–WY7 are stored in DFF (211)–(212). In addition, repair address latch signal WRDE is delayed by delay circuit (213); corresponding to the delayed repair address latch signal C, write data WRD0 from said timing logic circuit (12) is set in DFF (214) in latch (21).

After the aforementioned initial setting operation, the usual read operation is carried out.

In the read operation, read column address signals RY10–RY17 are output from read column counter (30). EOR-gates (221)–(222) in address comparison circuit (22) compare addresses B0–B7 stored as address N in DFF (211)–(212) in latch circuit (21) and read column address signals RY10–RY17 from read column counter (30). When the values of read column address signals RY10–RY17 are coincident with address N, address comparison circuit (22) outputs an address coincident signal via NOR-gate (223).

By means of read clock R1CK, this address coincident signal is latched in DFF (231); at the next timing of read clock R1CK, it is output from AND-gate (231) as a timing signal with a "high" level.

As explained above, only the Q-output of DFF (214) is on the "high" level; hence, the output of AND-gate (243) becomes "high" level, and the read operation is carried out for the data from the redundant memory cell, which is the same as the redundant memory cell assigned by said timing logic circuit (12).

For read port (3), the same operation as described above is also carried out. However, there are no parts in read port (3) that correspond to DFF (211)–(212), and DFF (214)–(217), and those in read port (2) are used in a shared form.

As explained above, common first-group fuses FA (1)–FA (16) and second-group fuses FB (1)–FB (4) are set in write port (1). As explained above, the fuses are fused by laser beam. In this way, in the read operation for read ports (2) and (3), the read operation can be performed from the redundant memory cell, which is identical to the write redundant memory cell.

The first-group fuses FA (1)–FA (16) and/or the second-group fuses FB (1)–FB (4) shown in FIG. 2 may be replaced by other address-generating means than fuses. For example, instead of fuses, it is possible to set up flip-flops and to set the aforementioned address into the flip-flops from the memory control circuit in the initial operation of the semiconductor memory device. In this case, there is no need to perform laser fusion, and it is possible to change the address of the defective memory cell to be substituted by the redundant memory cell even after the address of the defective memory cell is already set. That is, the freedom in the utilization of the redundant memory cell can be enlarged.

FIG. 5 shows the circuit configuration of a second embodiment of the redundant circuit of this invention.

According to this circuit configuration, in the case when there are a plurality of input/output ports as in the case of field memory, an address-generating circuit (40) which generates the address of the defective memory cell for the write ports and the read ports is arranged commonly. In this specific example, read ports (5), (7), and write ports (6), (8) are shown.

The address-setting operation for address-generating circuit (40) may be carried out using the fuses as described above or using latch circuits.

In the initial operation of the semiconductor memory device, an active signal ACT is output from a memory control circuit (not shown in the figure) to address-generating circuit (40). Corresponding to this active signal ACT, the address stored in address-generating circuit (40) is output. According to the memory control signal MEMCNT which is the delay signal of the active signal ACT, the address which are output from address-generating circuit (40) are stored in latch circuit (51).

The circuit configurations in read ports (5), (7) and write ports (6), (8) are virtually identical to the circuit configuration in read port (3) as shown in FIG. 2; the column address is applied from the various column counters.

In addition to the aforementioned schemes, this invention may also be implemented using various other modifications. For example, the various parts shown in FIG. 2, such as fuse decoder (11), gate circuit (13), and other circuit configurations may be replaced by other circuit configurations that can perform the same functions as the above.

The above description was made with respect to the case of the saving of one defective memory cell. However, it is also possible to save a plurality of defective memory cells, just by setting a plurality of the redundant circuits the same as the aforementioned type.

As explained above, according to this invention, independent of the number of input/output ports, it is acceptable to set a single address-generating circuit for the defective memory cell in the semiconductor memory device. Consequently, the circuit configuration of the redundant circuit is simplified, and the integration level of the semiconductor memory device can be increased.

In addition, as only one address-generating circuit is set, the address setting operation of the defective memory cell can be carried out in a simple way, the operation efficiency can thus be increased. There is also no problem in error setting of the addresses when a plurality of addresses are set.

What is claimed is:

1. A semiconductor memory device comprising:
   an array of memory cells;
   at least one redundant memory cell;
   a write access port, said write access port including addressing circuitry having an address input terminal for receiving a memory cell address, having a write decoder which generates a signal for accessing one of said memory cells of said array of memory cells in response to said memory cell address and said write decoder having the address of a defective memory cell stored therein in a nonvolatile manner, said write decoder generating a redundant write signal for accessing said redundant memory cell rather than said defective memory cell when said memory cell address corresponds to said address of said defective memory cell;
   a register responsive to said redundant write signal, said register storing said memory cell address when said memory cell address corresponds to said address of said defective memory cell in response to said redundant write signal;
   a plurality of read access ports each read access port including addressing circuitry for each of said read access ports, said addressing circuitry for each of said read access ports including a read decoder for selecting one memory cell of said array of memory cells to be addressed in response to an address signal provided on an address port, and a comparator, said comparator having a first input connected to said address port and a second input connected to said register, said comparator providing a redundant access signal to said read decoder which causes access to be provided to said redundant memory cell when said address signal and the address stored in said register correspond.

2. The memory device of claim 1 wherein said device is formed on a single substrate.

3. The memory device of claim 1 wherein said write decoder includes polysilicon fuses for storing said address of said defective memory cell in said nonvolatile manner.

4. The memory device of claim 3 wherein said polysilicon fuses are programmed by laser programming.

5. The memory device of claim 1 wherein said device comprises MOS transistors.

6. The memory device of claim 1 wherein said register comprise a plurality of D-type flip-flops, one flip-flop for each bit of said address.

* * * * *